United States Patent
Wakiya et al.

(10) Patent No.: US 6,638,899 B1
(45) Date of Patent: Oct. 28, 2003

(54) PHOTORESIST STRIPPING SOLUTION AND A METHOD OF STRIPPING PHOTORESISTS WITH THE SAME

(75) Inventors: Kazumasa Wakiya, Kanagawa-ken (JP); Masakazu Kobayashi, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 121 days.

(21) Appl. No.: 09/657,777

(22) Filed: Sep. 8, 2000

(30) Foreign Application Priority Data

Sep. 10, 1999 (JP) .............................. 11-258118

(51) Int. Cl.$^7$ ..................... H01L 21/302; C11D 9/04
(52) U.S. Cl. ................. 510/176; 510/175; 510/177; 252/79.1; 438/770; 438/773
(58) Field of Search ................. 430/138, 170, 430/203, 270.1, 331; 510/175, 176, 177; 438/773, 770; 252/79.1

(56) References Cited

U.S. PATENT DOCUMENTS

| | | |
|---|---|---|
| 5,792,274 A | 8/1998 | Tanabe et al. |
| 5,905,063 A | 5/1999 | Tanabe et al. |

FOREIGN PATENT DOCUMENTS

| | | |
|---|---|---|
| JP | 7-201794 | 8/1995 |
| JP | 7-271056 | 10/1995 |
| JP | 8-202052 | 8/1996 |
| JP | 9-197681 | 7/1997 |
| JP | 9-213612 | 8/1997 |
| JP | 9-213704 | 8/1997 |
| JP | 9-246222 | 9/1997 |
| JP | 9-283507 | 10/1997 |
| JP | 9-330981 | 12/1997 |
| JP | 10-55993 | 2/1998 |
| JP | 11-67632 | 3/1999 |
| JP | 11352703 | * 12/1999 |

* cited by examiner

Primary Examiner—Gregory E. Webb
(74) Attorney, Agent, or Firm—Wenderoth, Lind&Ponack, LLP

(57) ABSTRACT

A photoresist stripping solution which comprises (a) a salt of hydrofluoric acid with a base free from metal ions: (b) a water-soluble organic solvent; (c) a basic substance; and (d) water; and a method comprising etching a substrate using a photoresist pattern formed on the substrate as a mask, ashing the photoresist pattern, stripping the ashed photoresist pattern using the photoresist stripping solution as described above, and then rinsing the substrate with water. Thus, there are disclosed a photoresist stripping solution which is excellent not only in stripping away post-ashing residue (modified photoresist films) and post-etching residue (metal deposition) but also in protecting substrates from corrosion in the step of rinsing with water; and a method for stripping photoresists using the same.

16 Claims, 1 Drawing Sheet

PHOTORESIST STRIPPING SOLUTION AND A METHOD OF STRIPPING PHOTORESISTS WITH THE SAME

BACKGROUND OF THE INVENTION

1. Field of the Invention

This invention relates to a photoresist stripping solution and a method for stripping photoresists using the same. More particularly, the invention relates to a photoresist stripping solution which is excellent, in photolithography, not only in stripping residues such as modified or deteriorated photoresist films occurring after the etching step and the subsequent ashing step and post-etching metal deposition but also in preventing corrosion in the step of stripping and in protecting substrates from corrosion in the step of rinsing with water; and a method for stripping photoresists using the same. The invention is suitable for use in the fabrication of semiconductor devices such as ICs and LSIs, as well as liquid-crystal panel apparatus.

2. Description of Relevant Art

The fabrication of semiconductor devices such as ICs and LSIs, as well as liquid-crystal panel apparatus, comprises the steps of forming a uniform photoresist coating over metallic layers or insulating layers such as an $SiO_2$ film formed on a substrate by CVD; performing selective exposure and development to form a photoresist pattern; selectively etching the substrate having the metallic layers or the insulating layers such as an $SiO_2$ film formed thereon by CVD using the photoresist pattern as a mask to form a microcircuit; and removing the unwanted photoresist layer with a liquid stripper. To remove the unwanted photoresist layer, it has been a practice to use various organic liquid strippers from the viewpoints of safety and stripping capability.

Examples of the metallic layer formed by CVD include those made of aluminum (Al); aluminum alloys (Al alloys) such as aluminum-silicon (Al—Si), aluminum-copper (Al—Cu) and alumi-num-silicon-copper (Al—Si—Cu); titanium (Ti); titanium alloys (Ti alloys) such as titanium nitride (TiN) and titanium-tungsten (TiW); tantalum (Ta), tantalum nitride (TaN), tungsten (W), tungsten nitride (WN) and copper (Cu). In addition, use may be made of interlevel dielectric layers such as organic SOG (spin-on-glass) layers. These metallic, insulating and interlevel dielectric layers are formed in one or more layers on the substrate.

With the recent tendency toward highly integrated, high-density circuits, dry etching enabling fine etching with a higher density has become the major means. Also, it has been a practice to employ plasma ashing to remove the unnecessary photoresist layers remained after etching. After these etching and ashing treatments, residues comprising modified photoresist films and other components remain as referred to horn-like shaped "veil" or "fences" on the bottom or side wall of patterned grooves. In addition, etching of metallic layers builds up metal depositions. Such residues and depositions should be completely removed so as to keep good yields in the production of semiconductors.

In recent years, further high-density integrated substrates are needed and thus the treating conditions in the etching and ashing steps become more and more strict. As a result, metal conductors having much elevated corrosion resistance and stripping solutions showing much improved performance, compared with the conventional ones, are needed. That is to say, none of the conventional stripping solutions is usable in such ultrafine processing.

There have been frequently employed compositions containing fluorine compounds such as hydrofluoric acid in photoresist stripping solutions and liquids for removing modified films remained after ashing. For example, Unexamined Published Japanese Patent Application (Kokai) No. 201794/1995 discloses a cleaner for semiconductor devices containing a specific quaternary ammonium salt, a fluorine compound and an organic solvent; Unexamined Published Japanese Patent Application (Kokai) No. 197681/1997 discloses a resist stripping solution composition containing a salt of hydrofluoric acid with a base free from metal ions and a water-soluble organic solvent and having a pH value of 5 to 8 in the system; Unexamined Published Japanese Patent Application (Kokai) No. 67632/1999 discloses a cleaner for semiconductor devices containing a fluorine compound, a water-soluble organic solvent and water each in a specified amount; and Unexamined Published Japanese Patent Application (Kokai) No. 283507/1997 discloses a stripping agent containing a specific quaternary ammonium hydroxide, a nucleophilic amine compound having redox potential, sugars and/or sugar alcohols and water each at a specified ratio.

However, none of the stripping solutions and cleaners reported in these documents is effective at a practically available level in preventing metal conductors formed on high-density, highly integrated substrates from corrosion.

In addition, stripping solutions and cleaners containing fluorine compounds such as hydrofluoric acid suffer from a problem that substrates frequently corrode away in the step of rinsing with water which is usually performed after stripping and washing.

SUMMARY OF THE INVENTION

An object of the present invention, which has been completed under the above-described circumstances, is to provide a photoresist stripping solution which is excellent not only in stripping residues such as metal depositions and modified or deteriorated photoresist films occurring after the step of etching metal layers formed on highly integrated substrates and the subsequent ashing step, but also in corrosion-inhibiting effects in the stripping step and protecting substrates from corrosion in the step of rinsing with water.

Another object of the present invention is to provide a method of stripping photoresists using the above-described photoresist stripping solution.

Thus, according to its first aspect, the present invention provides a photoresist stripping solution which comprises (a) a salt of hydrofluoric acid with a base free from metal ions; (b) a water-soluble organic solvent; (c) a basic substance; and (d) water.

According to its second aspect, the present invention provides a method of stripping photoresists which comprises etching a substrate using a photoresist pattern formed on the substrate as a mask, ashing the photoresist pattern, stripping the ashed photoresist pattern using the photoresist stripping solution as described above, and then rinsing the substrate with water.

DETAILED DESCRIPTION OF THE INVENTION

Figure 1:
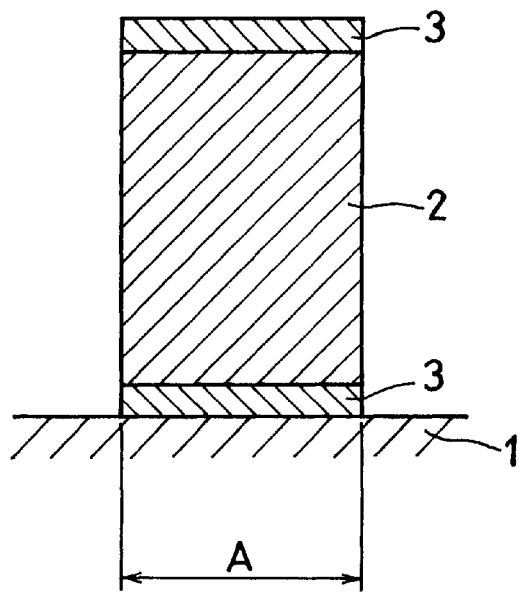
FIG. 1 schematically illustrates, in cross-section, of a metal conductor pattern obtained in Examples.

The invention will be described in greater detail.

In a salt of hydrofluoric acid with a base free from metal ions as component (a), preferred examples of the base free from metal ions include hydroxylamines; organic amines, such as primary, secondary, or tertiary aliphatic amines, alicyclic amines, aromatic amines and heterocyclic amines; aqueous ammonia; and lower-alkyl quaternary ammonium salts.

Examples of hydroxylamines include hydroxylamine ($NH_2OH$), N-methylhydroxylamine, N,N-dimethylhydroxylamine and N,N-diethylhydroxylamine.

Examples of primary aliphatic amines include monoethanolamine, ethylenediamine and 2-(2-aminoethylamino) ethanol.

Examples of secondary aliphatic amines include diethanolamine, dipropylamine and 2-ethylaminoethanol.

Examples of tertiary aliphatic amines include dimethylaminoethanol and ethyldiethanolamine.

Examples of alicyclic amines include cyclohexylamine and dicyclohexylamine.

Examples of aromatic amines include benzylamine, dibenzylamine, and N-methylbenzylamine.

Examples of heterocyclic amines include pyrrole, pyrrolidine, pyrrolidone, pyridine, morpholine, pyrazine, piperidine, N-hydroxyethylpiperidine, oxazole and thiazole.

Examples of lower-alkyl quaternary ammonium salts include tetramethylammonium hydroxide (TMAH), tetraethylammonium hydroxide, tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide and (1-hydroxyproyl)trimethylammonium hydroxide.

Among these examples, aqueous ammonia, monoethanolamine, tetramethylammonium hydroxide and (2-hydroxyethyl)trimethylammonium hydroxide are preferable because of their availability and safety.

The bases free from metal ions may be used either alone or in combination with one another.

The salt of hydrofluoric acid with the base free from metal ions may be prepared using a commercially available hydrofluoric acid having a concentration of 50–60% and adding thereto the base free from metal ions in such an amount that the resulting solution preferably has a pH of about 8.5 to 10. As the salt, ammonium fluoride ($NH_4F$) may be the most desirable. Either one or more salts may be used as component (a).

In the stripping solution according to the invention, the amount of component (a) is preferably not more than 30 wt %, more preferably not more than 20 wt %, and is preferably not less than 0.2 wt %, more preferably not less than 0.5 wt %, from the viewpoint of achieving well-balanced effects of stripping residues and protecting metal conductors from corrosion in the step of rinsing with water.

Component (b) is a water-soluble organic solvent. It is not specifically restricted so long as it is miscible with water and other components employed in the invention.

Examples of such water-soluble organic solvents include: sulfoxides, such as dimethyl sulfoxide; sulfones, such as dimethyl sulfone, diethyl sulfone, bis(2-hydroxyethyl) sulfone and tetramethylene sulfone; amides, such as N,N-dimethylformamide, N-methylformamide, N,N-dimethylacetamide, N-methylacetamide and N,N-diethylacetamide; lactams, such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones, such as 1,3-dimethyl-2-imidazolidinone, 1,3-diethyl-2-imidazolidinone and 1,3-diisopropyl-2-imidazolidinone; lactones, such as γ-butyrolactone and δ-valerolactone; and polyhydric alcohols and derivatives thereof, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether and diethylene glycol monobutyl ether. These organic solvents may be used either alone or in combination with one another. Among these examples, preferable ones are dimethyl sulfoxide, N,N-dimethylformamide, N,N-dimethylacetamide, N-methyl-2-pyrrolidone, 1,3-dimethyl-2-imidazolidinone, ethylene glycol and diethylene glycol monobutyl ether, since they are excellent in capability of stripping photoresists, modified films and residue. Among all, dimethyl sulfoxide, N-metyl-2-pyrrolidone, etc. are particularly preferable because of their good anticorrosive effects on substrates.

In the stripping solution according to the invention, the amount of component (b) is preferably not more than 80 wt %, more preferably not more than 75 wt %, and is preferably not less than 30 wt %, more preferably not less than 40 wt %, from the viewpoint of achieving well-balanced effects of stripping residue and protecting metal conductors from corrosion in the step of rinsing with water.

Preferred examples of the basic substance employed as component (c) include aqueous ammonia, hydroxylamines and amines having acid dissociation exponents (pKa) in aqueous solutions at 25° C. of from 7.5 to 13.

As examples of the above-described hydroxylamines, com-pounds represented by the following general formula (I) may be cited:

wherein $R^1$ and $R^2$ are each independently a hydrogen atom or a lower alkyl group having 1–6 carbon atoms.

Examples of the lower alkyl group having 1–6 carbon atoms include methyl group, ethyl group, propyl group, isopropyl group, butyl group, isobutyl group, sec-butyl group, tert-butyl group, pentyl group, isopentyl group, neopentyl group, tert-pentyl group, hexyl group, isohexyl group, 3-methylpentyl group, 2,2-dimethylbutyl group and 2,3-dimethylbutyl group.

Examples of the hydroxylamines as described above include hydroxylamine ($NH_2OH$), N-methylhydroxylamine, N,N-dimethylhydroxylamine and N,N-diethylhydroxylamine. These hydroxylamines may be used either alone or in combination with one another.

Specific examples of the amines having acid dissociation exponents (pKa) in aqueous solutions at 25° C. of from 7.5 to 13 as described above include alkanolamines, such as monoethanolamine, diethanolamine, triethanolamine, 2-(2-aminoethoxy)ethanol, N, N-dimethylehtanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine and triisopropanolamine; polyalkylenepolyamines, such as diethylenetriamine, triethylenetetramine, propylenediamine, N,N-diethylethylenediamine, N,N'-diethylethylenediamine, 1,4-butanediamine, N-ethyl-ethylenediamine, 1,2-propanediamine, 1,3-propanediamine and 1,6-hexanediamine; aliphatic amines, such as 2-ethyl-hexylamine, dioctylamine, tributylamine, tripropylamine, triallylamine, heptylamine and cyclohexylamine; aromatic amines, such as benzylamine and diphenylamine; and cyclic amines, such as piperazine, N-methyl-piperazine, methyl-piperazine and hydroxyethylpiperazine. Among these compounds, those having pKa as described above of from 8.5 to 11.5 are preferred. More particularly, it is favorable to use monoethanolamine, 2-(2-aminoethoxy)ethanol, diethylenetriamine, triethylenetetramine, cyclohexylamine, piperazine, etc.

Among all, it is particularly preferable as component (c) to use aqueous ammonia, hydroxylamine ($NH_2OH$), monoethanolamine, etc. It is preferable to use component (c) in such an amount as to adjust the solution to pH 8.5 to 10.0. By adjusting the pH value of the system in the above-described range by using component (c), the effect of protecting substrates from corrosion in the step of rinsing with water can be further improved.

Component (d) in the stripping solution according to the invention is water. Although some water is contained inevitably in component (b) etc., water is intentionally added according to the invention. In the stripping solution of the invention, the amount of component (d) is preferably not more than 50 wt %, more preferably not more than 40 wt %, and is preferably not less than 10 wt %, more preferably not less than 20 wt %.

The stripping solution of the invention may further contain, as an optional component, an acetylene alcohol/alkylene oxide adduct prepared by adding an alkylene oxide to an acetylene alcohol.

As the acetylene alcohol as described above, use may be preferably made of compounds represented by the following general formula (II):

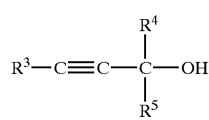

(II)

wherein $R^3$ is a hydrogen atom or the following formula:

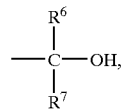

and $R^4$, $R^5$, $R^6$ and $R^7$ are each independently a hydrogen atom or an alkyl group having 1–6 carbon atoms.

These acetylene alcohols are commercially available under trade names of "Surfynol" and "Olfin" series (both are produced by Air Product and Chemicals Inc.). Of these commercial products, "Surfynol 104", "Surfynol 82" or mixtures thereof are most preferred for the physical properties. Use can be also made of "Olfin B", "Olfin P", "Olfin Y" etc.

As the alkylene oxide to be added to the acetylene alcohol as described above, it is preferable to use ethylene oxide, propylene oxide or a mixture thereof.

In the present invention, it is preferable to use, as the acetylene alcohol/alkylene oxide adduct, compounds represented by the following general formula (III):

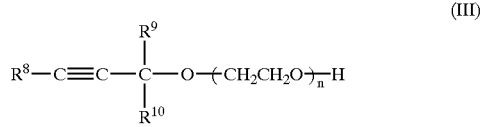

(III)

wherein $R^8$ is a hydrogen atom or the following formula:

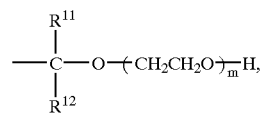

and $R^9$, $R^{10}$, $R^{11}$ and $R^{12}$ are each independently a hydrogen atom or an alkyl group having 1–6 carbon atoms; (n+m) is an integer of 1 to 30, which is the number of ethylene oxide molecules added. This number subtly affects the properties of the compound such as water solubility and surface tension.

The acetylene alcohol/alkylene oxide adducts per se are known as surfactants. These products are commercially available under the trade names of "Surfynol" series (products of Air Product and Chemicals Inc.) and "Acetylenol" series (products of Kawaken Fine Chemicals Co., Ltd.) and have been appropriately utilized. Among these products, it is preferred to use "Surfynol 440" (n+m=3.5), "Surfynol 465" (n+m=10), "Surfynol 485" (n+m=30), "Acetylenol EL" (n+m=4), "Acetylenol EH" (n+m=10) or mixtures thereof, in view of the changes in their physical properties such as water solubility and surface tension depending on the number of ethylene oxide molecules added. A mixture of "Acetylenol EL" with "Acetylenol EH" in a weight ratio of 2:8 to 4:6 is particularly desirable.

Use of the acetylene alcohol/alkylene oxide adduct makes it possible to improve the penetrating properties and wetting properties of the stripping solution.

When the stripping solution according to the invention contains the acetylene alcohol/alkylene oxide, the amount thereof is preferably not more than 5 wt %, more preferably not more than 2 wt %, and is preferably not less than 0.01 wt %, more preferably not less than 0.05 wt %. When the content exceeds the upper limit as defined above, the acetylene alcohol/alkylene oxide adduct causes foaming but the wetting properties cannot be improved any more. When the content is less than the lower limit as defined above, on the other hand, the desired improvement in the wetting properties can be scarcely established.

The stripping solution of the invention may further contain, if needed, an anticorrosive agent. Although an arbitrary anticorrosive agent employed in the conventional organic amine stripping solutions may be used therefor, it is preferable to use at least one member selected from the group consisting of aromatic hydroxyl compound, acetylene alcohols, carboxyl group-containing organic compounds and anhydrides thereof, triazole compounds and sugars. In the case of a Cu-wired substrate, corrosion can be effectively prevented in the steps of stripping the Cu conductor pattern and rinsing with water by using a benzotriazole compound.

Examples of the benzotriazole compound include compounds represented by the following general formula (IV):

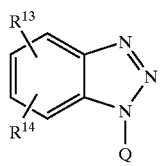

(IV)

wherein Q is a hydrogen atom, a hydroxyl group or a substituted or unsubstituted hydrocarbon group of 1–10 carbon atoms, an aryl group or the following formula:

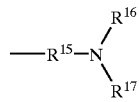

(wherein $R^{15}$ represents an alkyl group of 1–6 carbon atoms; and $R^{16}$ and $R^{17}$ are each independently a hydrogen atom, a hydroxyl group or a hydroxyalkyl group or an alkoxyalkyl group of 1–6 carbon atoms); and $R^{13}$ and $R^{14}$ are each independently a hydrogen atom, a substituted or unsubstituted hydrocarbon group of 1–10 carbon atoms, a carboxyl group, an amino group, a hydroxyl group, a cyano group, a formyl group, a sulfonylalkyl group or a sulfo group.

The term "hydrocarbon group" means an organic group consisting of carbon and hydrogen atoms. In the definition of the groups Q, $R^{13}$ and $R^{14}$ as specified in the present invention, each of the hydrocarbon groups may be an aromatic hydrocarbon group or an aliphatic hydrocarbon group, may be saturated or unsaturated, and may be a linear group or a branched group. Examples of a substituted hydrocarbon group include hydroxyalkyl groups and alkoxylalkyl groups.

In the case where copper (Cu) is used as the metal conductor, it is particularly preferable that Q in the above general formula (IV) is a group represented by the following formula:

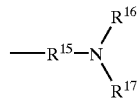

wherein $R^{15}$, $R^{16}$ and $R^{17}$ are each as defined above. In the above formula, it is particularly preferable that $R^{16}$ and $R^{17}$ are each independently a hydroxyalkyl group or an alkoxyalkyl group of 1–6 carbon atoms. When at least one of $R^{16}$ and $R^{17}$ is an alkyl group of 1–6 carbon atoms, the bezotriazole compound has a poor solubility in water. However, it is preferred to use such a compound in the case where the stripping solution contains other component allowing the dissolution of this compound.

Specific examples of the benzotriazole compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, 1-benzotriazole-methyl carboxylate, 5-benzotriazole-carboxylic acid, 1-methoxybenzotriazole, 1-(2,2-dihydroxyethyl) benzotriazole, 1-(2,3-dihydroxypropyl)benzotriazole, and products of "IRGAMET" series marketed from Ciba Speciality Chemicals such as 2,2-{([(4-methyl-1H-benzotriazol-1-yl)methyl]imino}bisethanol, 2,2-{[(5-methyl-1H-benzotriazol-1-yl)methyl]imino}bisethanol, 2,2-{[(4-methyl-1H-benzotriazol-1-yl)methyl]imino}bisethane and 2,2-{[(4-methyl-1H-benzotriazol-1-yl)methyl]imino}bispropane. Among these compounds, it is particularly preferable to use benzotriazole, 1-(2,3-dihydroxypropyl)benzotriazole, 2,2-{[(4-methyl-1H-benzotriazol-1-yl)methyl]imino}bisethanol, 2,2-{[(5-methyl-1H-benzotriazol-1-yl)methyl]imino}bisethanol, etc. in view of the effects of protecting Al alloy conductors and Cu conductors from corrosion.

When the stripping solution according to the invention contains the benzotriazole compounds, the amount thereof is preferably not more than 10 wt %, more preferably not more than 5 wt %, and is preferably not less than 0.1 wt %, more preferably not less than 0.5 wt %, from the viewpoint of achieving the effects of protecting Al alloy conductors or Cu conductors from corrosion and stripping post-ashing residues such as modified films.

The photoresist stripping solution according to the first aspect of the invention can advantageously be used with all photoresists, whether negative- or positive-working, that can be developed with aqueous alkaline solutions. Such photoresists include, but are not limited to, (i) a positive-working photoresist containing a naphthoquinonediazide compound and a novolak resin, (ii) a positive-working photoresist containing a compound that generates an acid upon exposure, a compound that decomposes with an acid to have a higher solubility in aqueous alkali solutions, and an alkali-soluble resin, (iii) a positive-working photoresist containing a compound that generates an acid upon exposure and an alkali-soluble resin having a group that decomposes with an acid to have a higher solubility in aqueous alkali solutions, and (iv) a negative-working photoresist containing a compound that generates an acid upon illumination with light, a crosslinker and an alkali-soluble resin.

The method of stripping photoresists according to the second aspect of the invention comprises the steps of forming a photoresist pattern obtained by lithography, etching a substrate, ashing the photoresist pattern, stripping the ashed photoresist pattern using the photoresist stripping solution according to the invention, and then rinsing the substrate with water.

More particularly, the method of stripping photoresists according to the invention comprises the steps of:

(I) providing a photoresist layer on a substrate already having an arbitrary metallic layer formed thereon;

(II) selectively exposing the photoresist layer;

(III) developing the exposed photoresist layer to form a photoresist pattern;

(IV) selectively etching the substrate using the photoresist pattern as a mask;

(V) plasma ashing the photoresist pattern;

(VI) stripping the ashed photoresist pattern from the substrate using the photoresist stripping solution according to the first aspect of the invention; and (VII) rinsing the substrate.

The substrate already having an arbitrary metallic layer formed thereon may be exemplified by substrates having formed thereon films of metals including aluminum (Al); aluminum alloys (Al alloys), such as aluminum-silicon (Al—Si), aluminum-copper (Al—Cu) and aluminum-silicon-copper (Al—Si—Cu): titanium (Ti): titanium alloys (Ti alloys), such as titanium nitride (TiN) and titanium-tungsten (TiW); and copper (Cu).

The application of a photoresist composition, the exposure and development of the photoresist layer and etching and plasma ashing may all be performed by conventional means.

More particularly, the stripping method of the invention can be carried out, for example, as follows.

First, a metallic layer (Al, Al alloy, Cu, etc.) is formed on a substrate such as a silicon wafer or a glass plate.

Next, a photoresist composition is applied onto the metallic layer, dried, exposed and developed to form a photoresist pattern. The conditions for exposure and development may be appropriately selected depending on the photoresist and its specific use. In exposure, the photoresist layer may be exposed through a desired mask pattern to a light source emitting actinic radiations (e.g., UV light, far-UV light, excimer laser, X-rays or electron beams) such as a low-pressure mercury-vapor lamp, a high-pressure mercury-vapor lamp, an ultra-high pressure mercury-vapor lamp or a xenon lamp. Alternatively, the photoresist layer is illuminated with controlled electron beams. Thereafter, post-exposure bake is optionally performed if needed.

Then, pattern development is performed with a photoresist developer to form a predetermined photoresist pattern. The method of development is not limited to any particular type and various methods may be employed as appropriate for the specific object. Examples thereof include dip development in which the photoresist-coated substrate is immersed in the developer for a specified time and then washed with water and dried; paddle development in which the developer id dripped on the surface of the applied photoresist coat which is thereafter left to stand for a specified time, washed with water and dried; and spray development in which the photoresist surface is sprayed with the developer and thereafter washed with water and dried.

Subsequently, with the photoresist pattern used as a mask, the metallic layer is selectively etched and plasma ashed. Then the post-ashing photoresist residues such as modified films adhering to the substrate surface are stripped away by bringing into contact with the stripping solution according to the invention.

Etching may be performed on either a wet or dry basis or two methods may be applied in combination, though it is preferred in the invention to employ dry etching.

Ashing is performed to remove the photoresist pattern. However, it is frequently observed that the photoresist pattern partly remains as modified films or post-etching residues such as metal depositions adhere to the substrate. The present invention is highly effective in stripping these post-ashing residues, such as modified photoresist films, and post-etching residues, such as metal depositions.

Stripping is usually performed by dipping or spraying. It is sufficient to carry out stripping for 10 to 20 minutes in usual, though the invention is not limited thereto.

Next, the substrate is rinsed with water. Use of the stripping solution of the invention makes it possible to solve the problem of the corrosion of metal conductors made of Al, Al alloys, Cu, etc. frequently encountering in the prior art, thereby remarkably improving the anticorrosive effect on these metal conductors. It is particularly outstanding that corrosion frequently arises in the step of rinsing with water in the case of using the conventional stripping solutions or cleaners containing fluorine compounds (e.g., hydrofluoric acid), while corrosion can be effectively prevented even in the water-rinsing step in the method according to the invention.

Moreover, the photoresist may be optionally heated after the exposure, i.e., post-exposure baking which is usually performed in the case of photoresists of chemical amplification type. It is also possible to carry out the post-baking after the formation of the photoresist pattern.

In the case of using a substrate having a copper (Cu) conductor pattern formed thereon as the metal conductor pattern, it is preferable to apply the following method according to the invention.

That is to say, a method for stripping photoresists which comprises the steps of:

(I) providing an etching stopper layer on a substrate having a Cu conductor pattern formed thereon, and further providing an interlevel dielectric layer thereon;

(II) providing a photoresist layer on the interlevel dielectric layer;

(III) selectively exposing said photoresist layer;

(IV) developing the exposed photoresist layer to form a photoresist pattern;

(V) etching, with the photoresist pattern used as a mask, the interlevel dielectric layer to leave the etching stopper layer;

(VI) plasma ashing the photoresist pattern;

(VII) stripping the etched photoresist pattern from the interlevel dielectric layer using the photoresist stripping solution according to the first aspect of the invention:

(VIII) stripping the etching stopper layer remained; and (IX) rinsing the substrate with water.

In step (V) as described above, the etching stopper layer is exemplified by a nitride film such as an SiN film. By etching the interlevel dielectric layer while leaving the etching stopper layer, the Cu conductor is substantially free from the effects of the subsequent plasma ashing.

The Cu conductor formed on the substrate may be a Cu alloy conductor comprising Cu as the main component (amounting to, e.g., 90 wt % or more) together with other metals such as Al. Alternatively, a pure Cu conductor may be used therefor.

Now, the stripping method will be described in greater detail. A Cu conductor pattern is formed on a substrates such as a silicon wafer or a glass plate, and an etching stopper layer (for example, an SiN film) is formed thereon, if desired. Next, an interlevel dielectric layer (for example, an organic SOG layer) is further formed thereon.

Next, a photoresist composition is applied onto the interlevel dielectric layer, dried, exposed and developed to form a photoresist pattern. The conditions for exposure and development may be appropriately selected depending on the photoresist and its specific use. In exposure, the photoresist layer may be exposed through a desired mask pattern to a light source emitting actinic radiations (e.g., UV light, far-UV light, excimer laser, X-rays or electron beams) such as a low-pressure mercury-vapor lamp, a high-pressure mercury-vapor lamp, an ultra-high pressure mercury-vapor lamp or a xenon lamp. Alternatively, the photoresist layer is illuminated with controlled electron beams. Thereafter, post-exposure bake is optionally performed if needed.

Then, pattern development is performed with a photoresist developer to form a predetermined photoresist pattern. The method of development is not limited to any particular type and various methods may be employed as appropriate for the specific object. Examples thereof include dip development in which the photoresist-coated substrate is immersed in the developer for a specified time and then washed with water and dried; paddle development in which the developer is dripped on the surface of the applied photoresist coat which is thereafter left to stand for a specified time, washed with water and dried; and spray development in which the photoresist surface is sprayed with the developer and thereafter washed with water and dried.

Subsequently, with the photoresist pattern used as a mask, the interlevel dielectric layer is selectively etched in such a manner as to leave the etching stopper layer, and plasma ashed to thereby remove the unwanted photoresist layer. Then the etching stopper layer remained is removed to form a fine-line circuit (hole pattern). In the case of performing plasma ashing, post-ashing photoresist residue (modified films) and post-etching residue (metal deposition) adhering to the substrate surface can be stripped away by bringing these residues on the substrate into contact with the stripping solution according to the invention.

Etching may be performed on either a wet or dry basis or two methods may be applied in combination, though it is preferred in the invention to employ dry etching.

Stripping is usually performed by dipping or spraying. It is sufficient to carry out stripping for 10 to 20 minutes in usual, though the invention is not limited thereto.

After the step of stripping as described above, the substrate is rinsed with water. It is particularly outstanding that corrosion frequently arises in the step of rinsing with water in the case of using the conventional stripping solutions or cleaners containing fluorine compounds (e.g., hydrofluoric acid), while corrosion can be effectively prevented even in the water-rinsing step in the method according to the invention.

After forming the pattern (particularly the hole pattern) by the above-described method, Cu is buried in it by a suitable means such as plating to provide electrical continuity. If desired, the same procedure may be repeated to form an upper level comprising an interlevel dielectric layer, a hole pattern and electrical continuity so as to fabricate a multi-level Cu-wired board.

The stripping solution according to the invention and the stripping method using the same have excellent effects in stripping away post-ashing photoresist films (modified films) and post-etching residue (metal deposition) even in highly integrated, high-density substrates, and, in protecting various metal conductors, metallic layers, etc. from corrosion in the step of treating with water.

To further illustrate the invention in greater detail, and not by way of limitation, the following examples will be given. Unless otherwise noted, all amounts of the components are expressed in wt %.

EXAMPLES 1–6 AND COMPARATIVE EXAMPLES 1–2

A TiN layer, an Al—Si—Cu layer and another TiN layer were successively formed on a silicone wafer respectively as the first, second and third layers. The substrate was spin coated with THMR-iP3300 (product of Tokyo Ohka Kogyo Co., Ltd.) which was a positive-working photoresist comprising a naphthoquinonediazide compound and a novolak resin and the applied coat was pre-baked at 90° C. for 90 seconds to form a photoresist layer of 0.2 µm in film thickness. This photoresist layer was exposed to light from NSR-2005i10D (product of NIKON CORP.) through a mask pattern, then developed with an aqueous solution of 2.38 wt % tetramethylammonium hydroxide (TMAH), and post-baked at 120° C. for 90 seconds to form a photoresist pattern of 0.6 µm in line-and-space.

Subsequently, the substrate having the photoresist pattern thus formed was etched using an etching apparatus TSS-6000 (product of Tokyo Ohka Kogyo Co., Ltd.) with a mixed gas (chlorine with boron trichloride) as an etchant at 5 mTorr for 168 seconds, with stable temperature kept at 20° C. Subsequently, an after corrosion treatment was performed to remove chlorine atoms by using a mixed gas (oxygen with trifluoromethane) at 20 mTorr for 30 seconds, with stable temperature kept at 20° C.

Then the photoresist pattern was ashed using an ashing apparatus TCA-3822 (product of Tokyo Ohka Kogyo Co., Ltd.) at 1.2 mTorr for 40 seconds, with stable temperature kept at 220° C. As a result, there remained ashing residue (modified films).

Next, the thus treated silicone wafer was dipped in each stripping solution having the composition as listed in Table 1 at 25° C. for 20 minutes to thereby strip the modified films. After the completion of the stripping treatment, each substrate was observed under an SEM (scanning electron microscope) in the stripping of the modified films and the corrosion of metal conductors in the first to third layers (in particular, the Al—Si—Cu conductor in the second layer).

As a result, all of the samples of Examples 1–6 and Comparative Examples 1–2 showed excellent stripping capability of modified films and showed no corrosion in the metal conductors of the first to third layers.

FIG. 1 schematically shows the metal conductor pattern employed above wherein the numerical symbol 1 stands for a substrate, the numerical symbol 2 stands for an Al—Si—Cu layer, the numericaly symbol 3 stands for a TiN layer, and the symbol A indicates the line width of the pattern.

[Anticorrosive Effect in the Step of Rinsing With Water]

To evaluate the corrosion state in the step of rinsing with water, highly strict rinsing conditions were prepared by force by adding water to each stripping solution given in Table 1 (stripping solution:water=3:7 by weight). After stripping away the modified films as described above, the substrate was dipped in the thus prepared solution at 25° C. for 3 to 20 minutes. The corrosion of the Al—Si—Cu conductor in the second layer was observed under an SEM (scanning electron microscope) and the etching rate per unit time (nm/min) was calculated from the amount of side etching thus formed. Table 2 shows the results.

Figure 2:
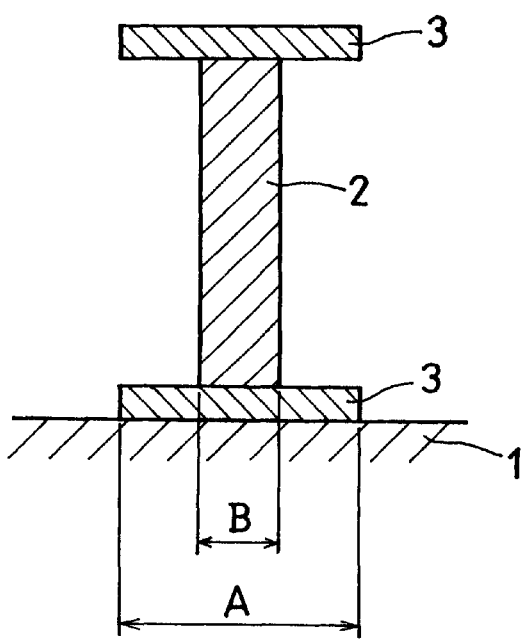
FIG. 2 schematically illustrates, in cross-section, of an etching rate employed in Examples.

FIG. 2 schematically shows the side etching in the Al—Si—Cu conductor in Table 2, wherein the etching rate is indicated as (A-B)/2 (nm).

TABLE 1

| | Photoresist stripping solution (wt %) | | | | | |
|---|---|---|---|---|---|---|
| | Comp. (a) | Comp. (b) | Comp. (c) | Comp. (d) | Other component | pH |
| Ex. 1 | FA (1.0) | DMSO (balance) | AA (0.1) | water (30.0) | — | 8.9 |
| Ex. 2 | FA (1.0) | DMSO (balance) | AA (0.3) | water (30.0) | — | 9.2 |
| Ex. 3 | FA (1.0) | DMSO (balance) | HA (0.2) | water (30.0) | — | 9.0 |
| Ex. 4 | FA (1.0) | NMP (balance) | MEA (0.1) | water (30.0) | — | 9.2 |
| Ex. 5 | FA (1.0) | DMSO (balance) | AA (0.1) | water (30.0) | acetylene alcohol/alkylene oxide adduct (0.1) | 8.9 |
| Ex. 6 | FA (1.0) | DMSO (balance) | AA (0.2) | water (30.0) | benzotriazole compound (1.0) | 8.9 |
| C. Ex. 1 | FA (1.0) | DMSO (balance) | — | water (30.0) | hydrofluoric acid (0.05) | 8.2 |
| C. Ex. 2 | FA (1.0) | DMSO (balance) | — | water (30.0) | — | 8.3 |

The abbreviations in Table 1 for the respective components have the following meanings: FA, ammonium fluoride; DMSO, dimethyl sulfoxide; AA, aqueous ammonia; HA, hydroxylamine; NMP, N-methyl-2-pyrrolidone; and MEA, monoethanolamine. As acetylene alcohol/alkylene oxide adduct in Example 5, use was made of a mixture of "Acetylenol EL" with "Acetylenol EH" (3:7, by weight) (products of Kawaken Fine Chemical Co., Ltd.). As benzotriazole compound in Example 6, use was made of 2,2([4-methyl-1H-benzotriazol-1-yl]methyl}imino}bisethanol.

TABLE 2

| | Etching rate (nm/min) of Al-Si-Cu conductor |
|---|---|
| Ex.1 | 11 |
| Ex.2 | 5 |
| Ex.3 | 9 |
| Ex.4 | 5 |
| Ex.5 | 10 |
| Ex.6 | 8 |
| C. Ex.1 | 31 |
| C. Ex.2 | 56 |

EXAMPLE 7

An etching stopper layer comprising an SiN film was provided on a Cu-wired substrate and then an interlevel dielectric layer comprising an organic SOG film was further formed thereon. The substrate having layers thusly formed thereon was spin coated with THMR-iP3300 (product of Tokyo Ohka Kogyo Co., Ltd.) which was a positive-working photoresist comprising a naphthoquinonediazide compound and a novolak resin and the applied coat was pre-baked at 90° C. for 90 seconds to form a photoresist layer of 2.0 μm in film thickness.

This photoresist layer was exposed to light from NSR-2005i10D (product of NIKON CORP.) through a mask pattern and then developed with an aqueous solution of 2.38 wt % TMAH (tetramethylammonium hydroxide) to form a photoresist pattern (hole space 0.5 μm). Next, it was post-baked at 120° C. for 90 seconds.

Subsequently, the substrate having the photoresist pattern thus formed was dry-etched. The etching was stopped as to leave the SiN layer and then the photoresist layer was removed with the use of an ashing apparatus TCA-38288 (product of Tokyo Ohka Kogyo Co., Ltd.). Subsequently, the substrate was dry-etched again so that the organic SOG layer and the SiN layer remained were completely removed. The residue was stripped away by using the stripping solution of Example 6 with the composition listed in Table 1.

[Anticorrosive Effect in the Step of Rinsing With Water]

To evaluate the corrosion state in the step of rinsing with water, highly strict rinsing conditions were prepared by force by adding water to the stripping solution of Example 6 with the composition given in Table 1 (stripping solution:water=3:7 by weight). After stripping the modified films as described above, the substrate was dipped in the thus prepared solution at 25° C. for 3 to 20 minutes. The corrosion of the Cu conductor was observed under an SEM (scanning electron microscope). As a result, Cu suffered from no corrosion.

As described above in detail, the stripping solution according to the invention and the method for stripping photoresists using the same are excellent not only in stripping post-ashing residue (modified photoresist films) and post-etching residue (metal deposition) but also in preventing corrosion in the step of stripping and protecting various metal conductors and metallic layers from corrosion in the step of rinsing with water.

What is claimed is:

1. A photoresist stripping solution which comprises (a) a salt of hydrofluoric acid with a base free from metal ions; (b) a water-soluble organic solvent; (c) a basic substance; and (d) water, and which solution has a pH value of from 8.5 to 10.0.

2. The photoresist stripping solution according to claim 1, wherein component (c) is at least one member selected from the group consisting of aqueous ammonia, hydroxylamines and amines having acid dissociation exponents (pKa) in aqueous solutions at 25° C. of from 7.5 to 13.

3. The photoresist stripping solution according to claim 1, wherein the base free from metal ions constituting component (a) is at least one member selected from the group consisting of hydroxylamines, primary, secondary or tertiary aliphatic amines, alicyclic amines, aromatic amines, heterocyclic amines, aqueous ammonia and lower-alkyl quaternary ammonium salts.

4. The photoresist stripping solution according to claim 1, wherein component (a) is ammonium fluoride ($NH_4F$).

5. The photoresist stripping solution according to claim 1, wherein component (b) is at least one member selected from the group consisting of dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether.

6. The photoresist stripping solution according to claim 1, wherein component (c) is at least one member selected from the group consisting of aqueous ammonia, hydroxylamine ($NH_2OH$) and monoethanolamine.

7. The photoresist stripping solution according to claim 1, which further contains an acetylene alcohol/alkylene oxide adduct.

8. The photoresist stripping solution according to claim 7, wherein the acetylene alcohol/alkylene oxide adduct is a compound represented by the following general formula (II):

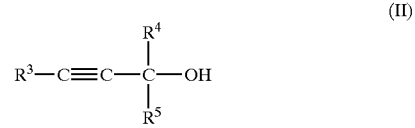

wherein $R^3$ is a hydrogen atom or the following formula:

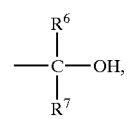

and $R^4$, $R^5$, $R^6$ and $R^7$ are each independently a hydrogen atom or an alkyl group having 1–6 carbon atoms.

9. The photoresist stripping solution according to claim 7, wherein the alkylene oxide constituting the acetylene alcohol/alkylene oxide adduct is ethylene oxide, propylene oxide or a mixture thereof.

10. The photoresist stripping solution according to claim 7, wherein the acetylene alcohol/alkylene oxide adduct is a compound represented by the following general formula (III):

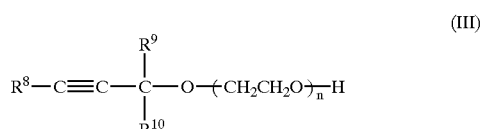

wherein $R^8$ is a hydrogen atom or the following formula:

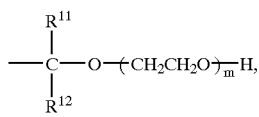

$R^9$, $R^{11}$ and $R^{12}$ are each independently a hydrogen atom or an alkyl group having 1–6 carbon atoms; and m+n is an integer of 1- to 30.

11. The photoresist stripping solution according to claim 1, which further contains a benzotriazole compound represented by the following general formula (IV):

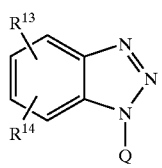

(IV)

wherein Q is a hydrogen atom, a hydroxyl group or a substituted or unsubstituted hydrocarbon group of 1–10 carbon atoms, an aryl group or the following formula:

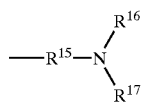

(wherein $R^{15}$ represents an alkyl group of 1–6 carbon atoms; and $R^{16}$ and $R^{17}$ are each independently a hydrogen atom, a hydroxyl group or a hydroxyalkyl group or an alkoxyalkyl group of 1–6 carbon atoms); and $R^{13}$ and $R^{14}$ are each independently a hydrogen atom, a substituted or unsubstituted hydrocarbon group of 1–10 carbon atoms, a carboxyl group, an amino group, a hydroxyl group, a cyano group, a formyl group, a sulfonylalkyl group or a sulfo group.

12. The photoresist stripping solution according to claim 11, which contains a benzotriazole compound of the above general formula (IV) wherein Q is a group represented by the following formula:

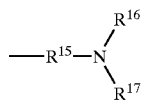

wherein $R^{15}$ is as defined above; and $R^{16}$ and $R^{17}$ are each independently a hydroxyalkyl group or an alkoxyalkyl group of 1–6 carbon atoms.

13. A method of stripping photoresists, which comprises etching a substrate using a photoresist pattern formed on the substrate as a mask; ashing the photoresist pattern; stripping the ashed photoresist pattern using the photoresist stripping solution according to any one of claims 1 to 6 and 7–12; and then rinsing the substrate with water.

14. The method of stripping photoresists according to claim 13, which comprises the steps of:

(I) providing a photoresist layer on a substrate already having an arbitrary metallic layer formed thereon;

(II) selectively exposing said photoresist layer;

(III) developing the exposed photoresist layer to form a photoresist pattern;

(IV) selectively etching the substrate using the photoresist pattern as a mask;

(V) plasma ashing the photoresist pattern;

(VI) stripping the ashed photoresist pattern from the substrate using the photoresist stripping solution according to any one of claims 1 to 6 and 7–12; and (VII) rinsing the substrate.

15. The method of stripping photoresists according to claim 13, which comprises the steps of:

(I) providing an etching stopper layer on a substrate having a Cu conductor pattern formed thereon, and further providing an interlevel dielectric layer thereon;

(II) providing a photoresist layer on the interlevel dielectric layer;

(III) selectively exposing said photoresist layer;

(IV) developing the exposed photoresist layer to form a photoresist pattern;

(V) etching, with said photoresist pattern used as a mask, the interlevel dielectric layer to leave the etching stopper layer;

(VI) plasma ashing the photoresist pattern;

(VII) stripping the etched photoresist pattern from the interlevel dielectric layer using the photoresist stripping solution according to any one of claims 1 to 6 and 7–12;

(VIII) stripping the etching stopper layer remained; and (IX) rinsing the substrate with water.

16. The method of stripping photoresists according to claim 14, wherein the photoresist stripping solution according to claim 13 is used in the step (VII).

* * * * *